(12) United States Patent  
Stoyan (10) Patent No.: US 9,341,328 B2
(45) Date of Patent: May 17, 2016

(54) METHOD OF PRODUCING A LIGHT EMITTING DIODE ARRANGEMENT AND LIGHT EMITTING DIODE ARRANGEMENT

(71) Applicant: OSRAM Gesellschaft mit beschräenkter Haftung, Munich (DE)

(72) Inventor: Harald Stoyan, Regensburg (DE)

(73) Assignee: OSRAM Gesellschaft mit beschrankter Haftung, Munich (DE)

( * ) Notice: Subject to any disclaimer, the term of this patent is extended or adjusted under 35 U.S.C. 154(b) by 84 days.

(21) Appl. No.: 14/107,759

(22) Filed: Dec. 16, 2013

(65) Prior Publication Data

US 2015/0167910 A1 Jun. 18, 2015

Related U.S. Application Data

(62) Division of application No. 11/904,170, filed on Sep. 26, 2007, now Pat. No. 8,637,882.

(30) Foreign Application Priority Data

Sep. 27, 2006 (DE) .......................... 10 2006 045 690
Jan. 25, 2007 (DE) .......................... 10 2007 003 809

(51) Int. Cl.
*H01L 29/18* (2006.01)
*H01L 21/02* (2006.01)
*F21S 2/00* (2016.01)
(Continued)

(52) U.S. Cl.
CPC .................. *F21S 2/005* (2013.01); *H05K 1/141* (2013.01); *H05K 1/147* (2013.01); *F21K 9/30* (2013.01); *F21V 23/06* (2013.01); *F21Y 2101/02* (2013.01); *H05K 1/142* (2013.01);

*H05K 1/148* (2013.01); *H05K 3/3442* (2013.01); *H05K 3/363* (2013.01); *H05K 2201/046* (2013.01); *H05K 2201/09963* (2013.01); *H05K 2201/10106* (2013.01); *Y10T 29/41* (2015.01)

(58) Field of Classification Search
CPC ................................. H01L 29/18; H01L 21/02
USPC .............. 438/28, 34; 257/98, 99; 362/249.02, 362/249.03, 249.06
See application file for complete search history.

(56) References Cited

U.S. PATENT DOCUMENTS 5,559,681 A * 9/1996 Duarte .......................... 362/231
6,936,855 B1 * 8/2005 Harrah ..................... F21K 9/00
257/59

(Continued)

FOREIGN PATENT DOCUMENTS

DE     198 48 078     4/2000
DE     199 26 746    12/2000

(Continued)

*Primary Examiner* — Evan Pert
*Assistant Examiner* — Changhyun Yi
(74) *Attorney, Agent, or Firm* — Cozen O'Connor (57) ABSTRACT

A method for producing a light emitting diode arrangement. A plurality of LED modules are provided, which in each case comprise at least one radiation emitting semiconductor component on a carrier body. At least one separately fabricated connection carrier is provided. The LED modules are arranged in such a way that they are adjacent to one another in pairs. A mechanically stable and electrically conductive connection between the carrier bodies of two LED modules is produced by means of the connection carrier. Furthermore, a light emitting diode arrangement is disclosed.

19 Claims, 8 Drawing Sheets

(51) Int. Cl.
*H05K 1/14* (2006.01)
*F21V 23/06* (2006.01)
*F21K 99/00* (2016.01)
*F21Y 101/02* (2006.01)
*H05K 3/34* (2006.01)
*H05K 3/36* (2006.01)

(56) References Cited

U.S. PATENT DOCUMENTS

| | | | |
|---|---|---|---|
| 7,365,991 | B2 | 4/2008 | Aldrich et al. |
| 2001/0013283 | A1* | 8/2001 | Pfundstein et al. ............ 101/35 |
| 2001/0024368 | A1* | 9/2001 | Henrici .................. F21S 2/005 362/235 |
| 2002/0113246 | A1 | 8/2002 | Nagai et al. |
| 2004/0175189 | A1 | 9/2004 | Weber-Rabsilber et al. |
| 2005/0179042 | A1 | 8/2005 | Yang et al. |
| 2005/0239342 | A1* | 10/2005 | Moriyama et al. ......... 439/699.2 |
| 2006/0006405 | A1 | 1/2006 | Mazzochette |
| 2006/0289888 | A1 | 12/2006 | Chiang |
| 2007/0035969 | A1 | 2/2007 | Kaneko et al. |
| 2007/0153508 | A1 | 7/2007 | Nall et al. |

FOREIGN PATENT DOCUMENTS

| | | |
|---|---|---|
| DE | 103 03 969 | 8/2004 |
| WO | WO 2006/105644 | 10/2006 |

* cited by examiner

METHOD OF PRODUCING A LIGHT EMITTING DIODE ARRANGEMENT AND LIGHT EMITTING DIODE ARRANGEMENT

RELATED APPLICATION

This application is a divisional of U.S. Ser. No. 11/904,170, filed Sep. 26, 2007, which claims priority of German Patent Applications 10 2006 045 690.4 filed Sep. 27, 2006 and 10 2007 003 809.9 filed Jan. 25, 2007, all of these applications being hereby incorporated by reference in their entireties.

FIELD OF THE INVENTION

The invention relates to a method for producing a light emitting diode arrangement, and to a light emitting diode arrangement.

BACKGROUND OF THE INVENTION

Linear light emitting diode arrangements are known, in which a plurality of light emitting diodes (LEDs) are arranged in a series on a common circuit board. The spatial arrangement and the electrical interconnection of the light emitting diodes is fixedly predetermined by the common circuit board in the case of these light emitting diode arrangements.

SUMMARY OF THE INVENTION

It is an object of the invention to provide a particularly flexible and easily modifiable method for producing a light emitting diode arrangement, and also an individually configurable light emitting diode arrangement.

This and other objects are attained in accordance with one aspect of the present invention directed to a method for producing a light that comprises the steps of:

providing a plurality of LED modules, which in each case comprise at least one radiation emitting semiconductor component on a carrier body;

providing at least one separately fabricated connection carrier;

arranging the LED modules such that they are adjacent to one another in pairs; and producing a mechanically stable and electrically conductive connection between the carrier bodies of two LED modules by means of the connection carrier.

The light emitting diode arrangement therefore comprises at least two LED modules. The main planes of extension of the carrier bodies preferably run in a common plane or at least parallel to a common plane. In a plan view of said plane, the LED modules are arranged in a row. In other words, the light emitting diode arrangement comprises an, in particular linear, chain of LED modules.

The spatial relationships specified below between the LED modules and/or between an LED module and the connection carrier, unless explicitly specified otherwise, should be understood in plan view of the common plane.

In the present context, a radiation emitting semiconductor component comprises at least one radiation emitting semiconductor chip based on an inorganic semiconductor material and/or at least one layer stack containing at least one organic layer, for example based on at least one polymer and/or low-molecular-weight material ("small molecules"). The semiconductor chip and/or the organic layer stack is provided for generating electromagnetic radiation. Preferably, the semiconductor chip and/or the layer stack generates electromagnetic radiation in the visible spectral range, for example white light. In one advantageous embodiment, the semiconductor chip and/or the layer stack is encapsulated, for example in a component housing.

The following embodiments are described in each case for LED modules comprising one radiation emitting semiconductor component. However, they apply correspondingly to LED modules comprising a plurality of radiation emitting semiconductor components.

In order to produce the connection between a first and a second LED module, adjacent to the first LED module, the connection carrier is preferably arranged between the two LED modules. By way of example, a connection carrier having a predetermined length is provided. In this case, the length of the connection carrier is in particular the extent of the connection carrier in the direction from the first to the second LED module after arrangement between the LED modules.

The embodiments described below for two adjacent LED modules and one connection carrier preferably apply to a plurality of LED modules and connection carriers, in particular to all LED modules and connection carriers of the light emitting diode arrangement.

In an advantageous manner, the length of the connection carrier can be chosen essentially freely. Thus, the method can be used to produce different light emitting diode arrangements with different distances between the LED modules. In contrast to conventional light emitting diode arrangements, a completely new design of the light emitting diode arrangement is not required for this purpose. Rather, the different light emitting diode arrangements are advantageously constructed in a simple and cost-effective manner from components which are preferably standardized. In particular, only a small number of different components is necessary.

Without any change at the LED modules themselves, it is possible to produce for example light emitting diode arrangements having a small distance between the individual radiation emitting semiconductor components, and other light emitting diode arrangements having a large distance between the radiation emitting semiconductor components. A light emitting diode arrangement in which the LED modules have different distances depending on the position in the light emitting diode arrangement is also conceivable. Since for example only the length of the connection carriers has to be changed for all of these different light emitting diode arrangements, the method for producing the light emitting diode arrangement is advantageously particularly flexible and easily modifiable.

By way of example, the connection carrier to be provided is fabricated with a predetermined length. As an alternative, it is possible to provide a carrier tape or a carrier plate which has, in particular, a long length and from which a segment having the predetermined length is separated during the method, said segment constituting the connection carrier or being processed further to form the latter.

In an advantageous manner, the distance between the two LED modules can be chosen essentially freely and is expediently fixed at the desired value by the predetermined length of the connection carrier which can likewise be chosen practically freely.

In one embodiment, the electrically conductive connection between the two LED modules is produced in such a way that the radiation emitting semiconductor component of the first LED module and the radiation emitting semiconductor component of the second LED module are connected in series. In one variant of this embodiment, three or more radiation emitting semiconductor components arranged, in particular, on three or more LED modules that are adjacent in pairs are connected in series.

As an alternative or in addition, in one embodiment, the electrically conductive connection is produced in such a way that a plurality of LED modules or groups of LED modules are connected in parallel.

Thus, a particularly simple adaptation of the light emitting diode arrangement to a power supply device provided for the operation of the light emitting diode arrangement is obtained by means of the production method. In this case, all or at least a majority of the LED modules used are advantageously independent, for example, of the supply voltage made available by the power supply device during operation. The method therefore advantageously involves constructing light emitting diode arrangements for different power supply devices with identical, in particular standardized, components—for example identical LED modules—, such that the components can be produced in large numbers and their production is therefore particularly cost-effective.

In one advantageous embodiment, the light emitting diode arrangement, in particular each group of LED modules, contains at most three different types of LED modules that are selected from the group consisting of a start module, a central module and an end module. To put it another way, each LED module is associated with a type of LED modules constructed in type-identical fashion and the light emitting diode arrangement preferably contains at most three different types of LED modules.

By way of example, the group of LED modules comprises a start module only, a start module and an end module adjacent to the start module, or a start module, at least one central module and an end module. The central module or the central modules is/are arranged between the start module and the end module.

In one embodiment, the radiation emitting semiconductor component of the start module is electrically connected to a first electrical terminal provided for connection to the external power supply device. By way of example, a supply voltage is made available to the light emitting diode arrangement by the power supply device by means of the first terminal during operation.

The radiation emitting semiconductor component of the end module is preferably electrically conductively connected to a second electrical terminal likewise provided for connection to the electrical power supply device. By way of example, the second electrical terminal is grounded by means of the power supply device during operation.

In addition, the radiation emitting semiconductor component of the start module is preferably connected in series with the radiation emitting semiconductor component of that LED module of the group of LED modules which is adjacent in the direction towards the end module and/or the radiation emitting semiconductor component of the end module is connected in series with the radiation emitting semiconductor component of that LED module of the group of LED modules which is adjacent in the direction towards the start module.

The radiation emitting semiconductor component of the central module is preferably connected in series both with the radiation emitting semiconductor component of the LED module that is adjacent in the direction of the start module, and with the radiation emitting semiconductor component of the LED module that is adjacent in the direction of the end module.

In particular, therefore, all of the radiation emitting semiconductor components of the group of LED modules are connected in series. If the LED modules of a group of LED modules in each case comprise a plurality of radiation emitting semiconductor components, then the latter are preferably connected in series in groups, a group of radiation emitting semiconductor components connected in series preferably containing at least one radiation emitting semiconductor component from each LED module of the group.

In one embodiment of the method, two LED modules are arranged at a predetermined distance adjacent to one another. In a further, for example subsequent, method step, the connection carrier is arranged between the two LED modules. In one advantageous embodiment, the connection carrier is arranged in such a way that a first edge region of the connection carrier is adjacent to or overlaps a first edge region of the carrier body of the second LED module, and in such a way that a second edge region of the connection carrier is adjacent to or overlaps a second edge region of the carrier body of the first LED module.

Expediently, at least one electrical terminal in each case, but preferably a plurality of electrical terminals, are formed in the first edge region and in the second edge region on the carrier body and on the connection carrier.

By way of example, a connection layer is applied in the first and/or second edge region on the connection carrier and/or the carrier body of the first and/or second LED module, which connection layer imparts an adhesion between the connection carrier and the carrier body or between the connection carrier and/or the carrier body and a separate connection element when the connection is produced.

In one embodiment, the first edge regions of the connection carrier and of the second LED module and the second edge regions of the connection carrier and of the first LED module overlap. In an alternative embodiment, it is provided that the connection carrier overlaps only the carrier body of one of the LED modules or none of the carrier bodies.

This last is expedient, for example, if producing the mechanically stable and/or the electrically conductive connection comprises producing a plug connection. By way of example, in one embodiment, a plug and a socket, which are fixed to the carrier body of one of the LED modules and/or to the connection carrier, are provided as connection element in the case of the plug connection for producing the mechanically stable and/or electrically conductive connection.

In another embodiment, a flexible connection is produced between the connection carrier and at least one of the adjacent carrier bodies which the connection carrier does not overlap, in particular. By way of example, the connection carrier is connected to the carrier body by means of a connection element in the form of a film hinge. A film hinge comprises a flexible circuit board, for example, and, in one advantageous embodiment, is connected to the connection carrier and the carrier body in such a way that an electrically conductive connection is produced between at least one electrical terminal of the connection carrier and an electrical terminal of the carrier body. A flexible light emitting diode arrangement is advantageously produced in this manner. The configuration of the electrically conductive connection, for example in this embodiment, is also conceivable as crimp or pinch connection.

Particularly if the first and/or second edge regions of the connection carrier and of the carrier body or carrier bodies overlap, at least in each case one electrical terminal on the carrier body and an electrical terminal on the connection carrier expediently overlap as well. Expediently, in this case the electrical terminals are arranged on a main face of the connection carrier and a main face of the carrier body and the connection carrier is arranged between the two LED modules in such a way that the main faces of the carrier bodies which have the electrical terminals and the main face of the connection carrier which has the electrical terminals face one another.

In one embodiment, the connection layer is electrically conductive. It contains for example a soldering metal such as SnAgCu, AuSn and/or Sn. As an alternative, it can have an electrically conductive adhesive, for example an epoxy-resin-based adhesive containing metal particles, for instance silver particles. In one embodiment, the adhesive can be cured by means of application of heat or electromagnetic radiation, in particular UV light. The electrically conductive connection layer is expediently applied in partial regions that are electrically insulated from one another, or is structured after application to form partial regions that are electrically insulated from one another. By way of example, a partial region of the connection layer is applied to a respective electrical terminal.

In this way, the connection layer advantageously produces an electrically conductive connection between an electrical terminal of the carrier body of the first and/or second LED module and an electrical terminal of the connection carrier.

In one advantageous embodiment, the production method comprises heating and/or melting the connection layer. By way of example, the connection layer is heated and/or melted by means of a heated stamp which is arranged in the first and/or second edge region and, in particular, is brought into contact with the carrier body or the carrier bodies and/or the connection carrier and is preferably pressed onto them (it). For producing a connection by means of a connection layer containing an adhesive, a stamp which is not heated but rather which is only brought into contact with the carrier body or the carrier bodies and/or the connection carrier and is preferably pressed onto them (it) may also be expedient.

In a further advantageous embodiment of the method, the connection layer is heated and/or melted in the first edge region by means of a first heated stamp and in the second edge region by means of a second heated stamp. By way of example, the two stamps are arranged on a common mount.

The distance between the stamps is expediently adapted to the length of the connection carrier. The distance can preferably be set for different lengths of the connection carrier. By way of example, the mount is formed in adjustable fashion for this purpose, such that the stamps can be shifted on the mount in such a way that their distance changes. As an alternative, the mount can for example also have a plurality of fixing devices by means of which the stamps can be connected to the mount at different positions, such that different distances can be set.

In one advantageous embodiment of the method, a plurality of pairs of LED modules are connected at the same time. By way of example, for this purpose, alongside the first and the second heated stamp, at least one third heated stamp, in particular likewise at the common mount, is provided and/or at least one heated stamp is provided for heating and/or melting the connection layer in a plurality of edge regions, for example in one first and one second edge region, in two first and/or two second edge regions.

In one particularly advantageous embodiment of the method, a plurality of light emitting diode arrangements are produced at the same time, for example by a plurality of LED module chains being processed alongside one another. A particularly efficient and cost-effective production is thus possible.

In one advantageous embodiment, the light emitting diode arrangement comprises at least one LED module having a control device. In particular, each group of LED modules comprises an LED module, for example the start module, having a control device. The control device is provided for driving the radiation emitting semiconductor component of the LED module and, in particular, produces the electrical connection between the radiation emitting semiconductor component and the first electrical terminal provided for connection to the external power supply device.

In a further advantageous embodiment, the control device is additionally provided for driving at least one further radiation emitting semiconductor component that is arranged, in particular, on a further, preferably adjacent, LED module. By way of example, the radiation emitting semiconductor components driven by the control device are connected in series or are connected in series in groups.

In one expedient embodiment, at least one LED module of the light emitting diode arrangement has an electrical terminal region by means of which electrical energy is fed to the light emitting diode arrangement by a power supply device during operation.

In one preferred embodiment, the connection carrier has at least one conductor track for electrically conductively connecting two adjacent LED modules. Preferably, the connection carrier and/or the carrier body comprises a circuit board, for example a printed circuit board (PCB).

DETAILED DESCRIPTION OF THE DRAWINGS

Similar or similarly acting constituent parts are provided with identical reference symbols in the figures. In any case, the elements illustrated in the figures and their size relationships among one another should not be regarded as true to scale, rather individual elements may be represented with an exaggerated size, for example, for the sake of better representability and/or for the sake of better understanding.

In a first exemplary embodiment of the method according to the invention for producing a light emitting diode arrangement, three different types 110, 120, 130 of LED modules are provided.

The LED modules 110, 120, 130 have a carrier body 1300, on which a radiation emitting semiconductor component 1000 is fixed.

The radiation emitting semiconductor component of at least one LED module 110, 120, 130, preferably of all the LED modules 110, 120, 130 of the light emitting diode arrangement, is a light emitting diode, for example. In the present case, the semiconductor component 1000 in operation emits electromagnetic radiation that generates a white colour impression. In a further embodiment, the radiation emitting semiconductor component contains a plurality of semiconductor chips that emit visible light of different colours, for example red, blue and/or green colour. Preferably, the semiconductor chips are provided for being driven separately by the control device 1400, for example. A light emitting diode arrangement 1 whose colour impression can be altered during operation of the light emitting diode arrangement 1 is thus obtained.

In the present case, the carrier bodies 1300 have a square or rectangular form in a plan view of their main plane of extension. At two mutually opposite sides of the rectangle or square, in edge region 1100, 1200, electrical terminal 1110, 1120, 1130 and 1210, 1220, 1230, respectively, are formed on a first main face 1301 of the carrier body 1300.

Two electrical terminals 1110, 1130 in the first edge region 1100 are electrically conductively connected to a respective electrical terminal 1210, 1230 of the second edge region 1200, for example by means of a respective electrical contact strip 1401, 1402—for example a conductor track. The electrical terminals 1110, 1210 and 1130, 1230 and the associated contact strips 1401, 1402 are suitable for providing a supply voltage, which is fed into the light emitting diode arrangement by an external power supply device during operation via an electrical terminal region of one of the LED modules 110, 120, 130, at the rest of the LED modules 110, 120, 130 of the light emitting diode arrangement as well. In an advantageous manner, a plurality of LED modules or groups 140 (see FIG. 4) of LED modules 110, 120, 130 can thus be operated in parallel connection with only one electrical terminal connection to an external power supply device.

Figure 1A:
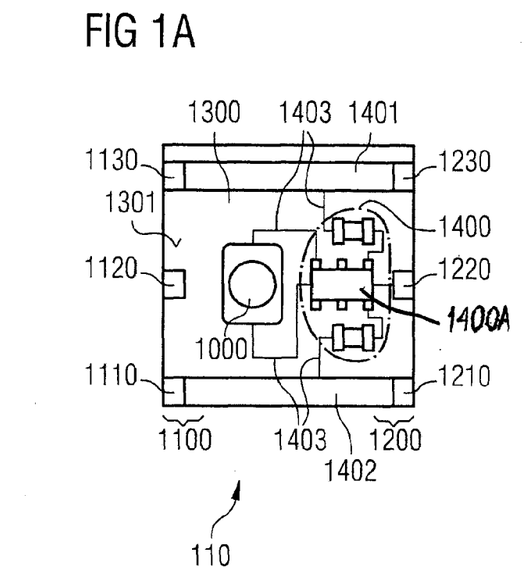
FIGS. 1A to 1C show schematic plan views of a start module, a central module and an end module for a method for producing a light emitting diode arrangement in accordance with a first exemplary embodiment.

The LED module 110 shown in FIG. 1A represents a start module for a group 140 of LED modules 110, 120, 130. It has a control device 1400, for example, which is provided for supplying the radiation emitting semiconductor component 1000 with power during operation of the light emitting diode arrangement. For this purpose, the control device 1400 is electrically conductively connected to the first contact strip 1401, for example by means of a conductor track 1403. In the present case, it is also electrically conductively connected to the second contact strip 1402.

Usually, light emitting diodes are not connected directly to a power supply like a battery or the AC line voltage. Rather, connection is made, for example, via a resistor, a diode, a voltage-limiting device, rectifier or a combination of at least two of these. Further, a device can be used that is suitable for turning on and off the light emitting diode, for example by generating a pulsed current, and/or for dimming the light emitting diode, for example via pulse-width modulation. Such functionality can be implemented using either individual electronic components or integrated circuits. The control device 1400 is meant to incorporate such functionality. In the figures, the control device 1400 contains one element which resembles an encapsulated microchip 1400A, but this is only to be regarded as an example.

A first electrical terminal of the radiation emitting semiconductor component 1000 is connected to the control device 1400 by means of a further conductor track 1403. A second electrical terminal of the radiation emitting semiconductor component 1000 is electrically conductively connected to an electrical terminal 1220 in the second edge region 1200 of the carrier substrate 1300. In FIG. 1A, the conductor track 1403 that is connected to electrical terminal 1220 passes under, but not in electrical contact with, microchip component 1400A which is part of control device 1400.

Figure 1B:
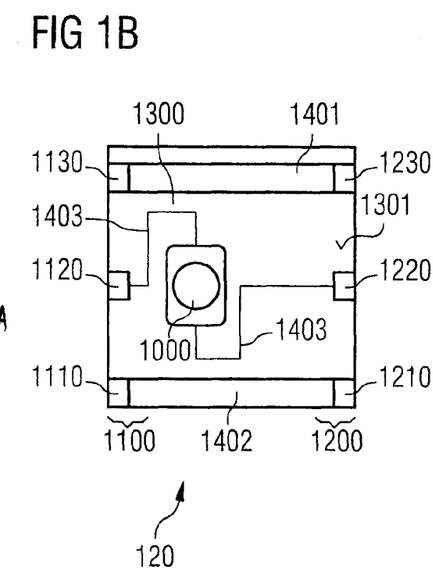

The second LED module, illustrated in FIG. 1B, is a central module. In contrast to the LED module 110 in FIG. 1A, it does not have a control unit 1400, but rather only a radiation emitting semiconductor component 1000 having two electrical terminals, of which the first is connected to an electrical terminal 1120 in the first edge region 1100 and the second is connected to an electrical terminal 1220 of the second edge region 1200. However, there is no electrically conductive connection between the radiation emitting semiconductor component 1000 and the first or the second contact strip 1401, 1402.

Figure 1C:
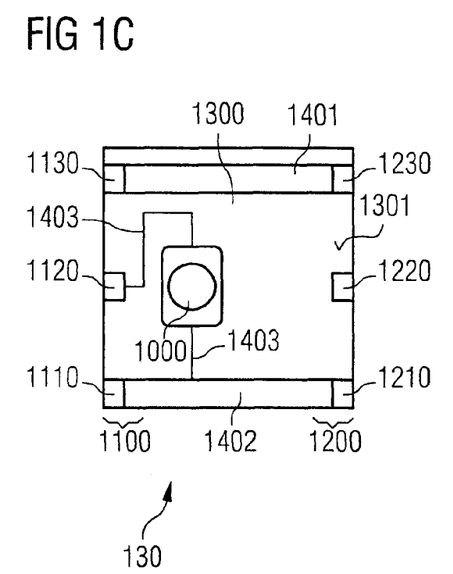

In contrast thereto, in the LED module 130 in accordance with FIG. 1C—an end module—, the second electrical terminal of the radiation emitting semiconductor component 1000 is connected to the second contact strip.

Figure 2A:
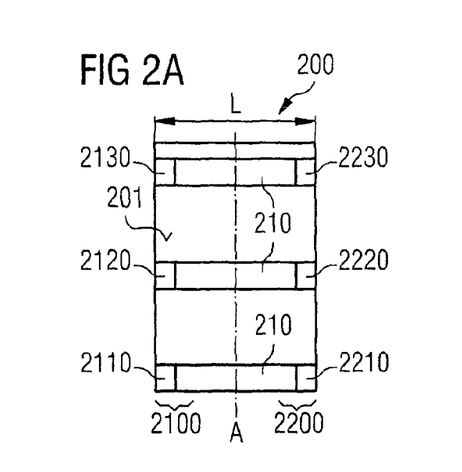
FIGS. 2A to 2C show schematic plan views of various connection carriers for the production method in accordance with the first exemplary embodiment.
Figure 2B:
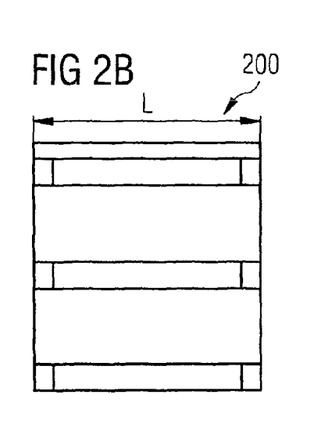
Figure 2C:
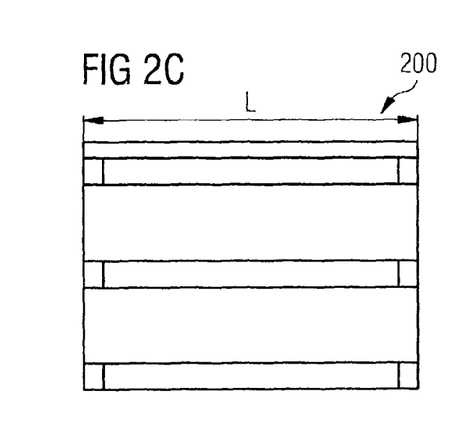

Furthermore, as shown in FIGS. 2A, 2B and 2C, the method involves providing a plurality of connection carriers 200. By way of example, a connection carrier has a rectangular or square cross section in a plan view of its main plane of extension. The connection carrier 200 has two mutually opposite edge regions 2100, 2200 in a plan view of its main plane of extension. In the present case, the side length of the sides of the connection carrier 200 which are encompassed by the edge regions 2100, 2200 matches the side length of the sides of the carrier body 1300 of an LED module 110, 120, 130 which are encompassed by the edge regions 1100, 1200.

The edge regions 2100, 2200 in each case have a plurality of electrical terminals 2110, 2120, 2130 and 2210, 2220, 2230 on a first main face 201 of the connection carrier 200. A contact location 2110, 2120, 2130 of the first terminal region 2100 is in each case connected to a contact location 2210, 2220, 2230 of the second edge region 2200 in an electrically conductive manner, for instance by means of a conductor track 210.

The connection carrier 200 has a predetermined length L in the direction from the first edge region 2100 to the second edge region 2200. Connection carriers having different lengths L are suitable for the method. Thus, as an example, FIG. 2A shows a connection carrier 200 having a length L=20 mm, the length L of the connection carrier in FIG. 2B is L=30 mm, and the length L of the connection carrier 200 in accordance with FIG. 2C is 40 mm. Connection carriers having other lengths L, for example 10 mm, 14 mm, 15 mm or 50 mm, are likewise conceivable.

Figure 3:
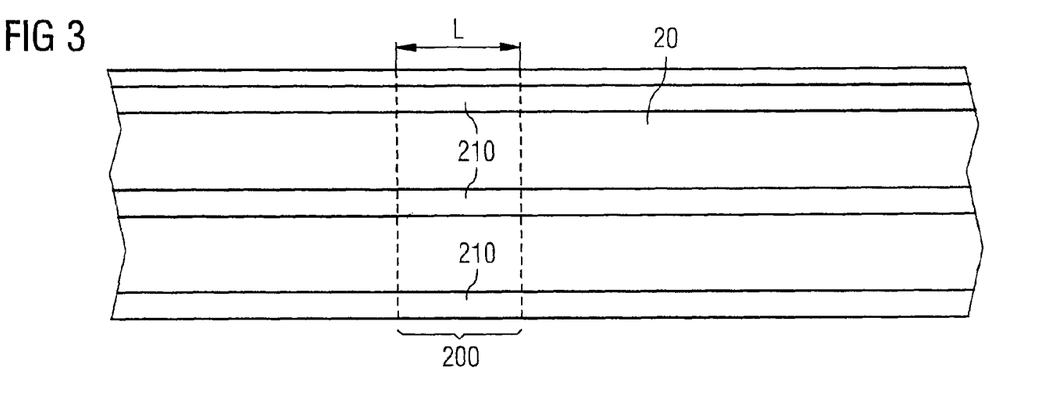
FIG. 3 shows a schematic plan view of a carrier tape in accordance with one variant of the first exemplary embodiment.

Instead of a connection carrier 200 having a predetermined length L, a carrier plate or a carrier tape 20 having for example a plurality of electrical connection means such as conductor tracks can also be provided (cf. FIG. 3). Individual connection carriers 200 having a predetermined length L are then separated from the carrier tape or the carrier plate 20 in an additional method step. The carrier tape or the carrier plate 20 is produced in an arbitrary, in particular long, length, such that a large number of connection carriers 200 can be produced from a carrier tape or a carrier plate 20, which is also known as a "quasi-continuous method".

Figure 4:
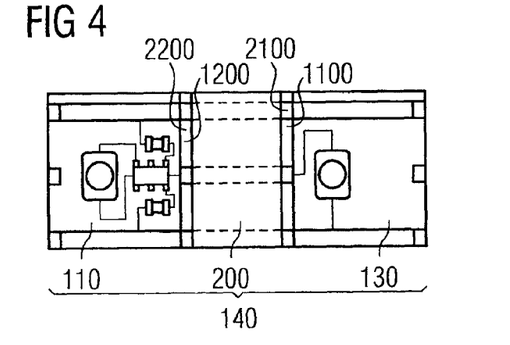
FIGS. 4, 5 and 6 show schematic plan views of a light emitting diode arrangement in different stages of the production method in accordance with the first exemplary embodiment.

In a subsequent method step, two LED modules 110, 130 are arranged in such a way that their main planes of extension are at least substantially parallel and the second edge region 1200 of the first of the two LED modules 110 is adjacent to the first edge region 1100 of the second of the two LED modules 130 (cf. FIG. 4). The connection carrier 200 is subsequently arranged between the two LED modules 110, 130 in such a way that its main plane of extension is likewise substantially parallel to the main planes of extension of the LED modules 110, 130. Furthermore, the arrangement is effected in such a way that the second edge regions 1200, 2200 of the first LED module 110 and of the connection carrier 200 and the first edge regions 1100, 2100 of the second LED module 130 and of the connection carrier 200 overlap and the electrical terminals 1110, 1120, 1130 and 2110, 2120, 2130 and, respectively, 1210, 1220, 1230 and 2210, 2220, 2230 face one another and likewise overlap—in particular pairwise—in a plan view of the main planes of extension. In FIG. 4, therefore, the connection carrier 200 is rotated by 180° about the axis A relative to the illustration in FIG. 2A and the first main areas 1301, 201 of the carrier bodies 1300 and of the connection carrier 200 face one another.

In the present exemplary embodiment, a connection layer is arranged on the electrical terminals 2110, 2120, 2130, 2210, 2220, 2230 in the edge regions 2100, 2200 of the connection carrier 200. In the present case, a connection layer is also arranged on the electrical terminals 1110, 1120, 1130 of the first edge region 1100 and on the electrical terminals 1210, 1220, 1230 of the second edge region 1200 of the carrier bodies 1300. After the production of the connection between the connection carrier 200 and the first and second LED module 110, 130, the connection layers impart the adhesion between the connection carrier and the LED modules. Electrically conductive connection layers, for instance tin layers and/or solder layers, having SnAgCu or AuSn, for example, are preferably involved. The thickness of the connection layers is for example in each case between 10 and 100 µm, the limits being included.

Figure 5:
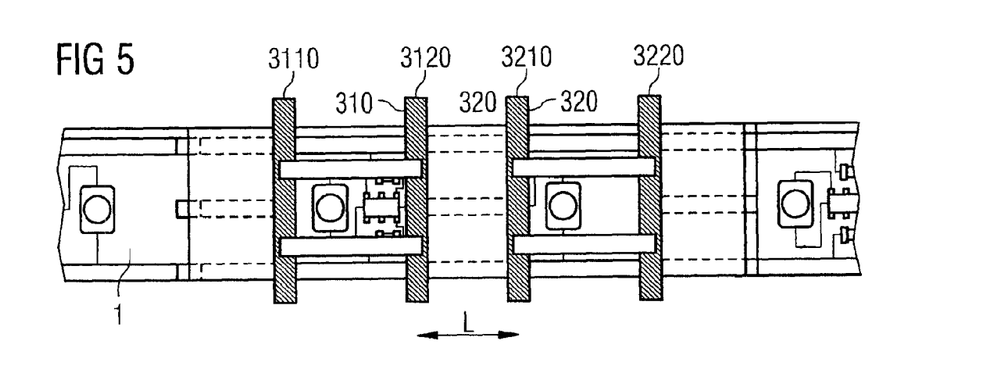

Afterwards, the connection layers are melted and in particular fused together by being heated by means of two heated stamps 310, 320 (FIG. 5). In this case, the first stamp 310 is positioned in such a way that it covers the second edge region 1200, 2200 at least partly, but preferably completely, in a plan view of the main planes of extension of the LED modules 110, 130 and of the connection carrier 200. The second stamp 320 correspondingly covers the first edge region 2100, 1100.

In the present case, the connection carrier 200 is situated between the stamp 310, 320 and the LED module 110, 130 during the production of the connection. As an alternative, the LED module 110, 130 can also be situated between the connection carrier 200 and the heated stamp 310, 320.

The heated stamp 310, 320 is pressed onto the connection carrier 200 or the LED module 110, 130. Thus, in an advantageous manner, a particularly good heat transfer is obtained and the connection layers are melted rapidly. Moreover, as a result of the stamp 310, 320 being pressed on, a particularly well fitting and stable connection is advantageously produced between the connection carrier 200 and the LED module 110 or 130.

The stamps 310, 320 are heated by means of a resistance heating arrangement, for example, which converts electrical current into heat by means of an in particular ohmic resistance and is arranged for example within the stamps.

In an alternative embodiment, the connection carrier 200 and/or at least one of the carrier bodies 1300 have a connection layer having an electrically conductive adhesive such as silver conductor adhesive, that is to say in particular an epoxy resin based adhesive filled with silver particles. A stamp 310, 320 can likewise be provided in this embodiment, by means of which for example the connection carrier 200 and the LED module(s) 110, 130 are pressed onto one another. The stamp 310, 320 need not be heated in this embodiment, but a heated stamp 310, 320 can also be provided, for example for thermally curing the adhesive.

In the present case, the stamps 310, 320 are provided for connecting a first and a second edge region 1100, 2100 and 1200, 2200 at the same time. For this purpose, each of the stamps 310, 320 comprises two stamp strips 3110, 3120 and 3210, 3220, respectively, the distance between which is chosen such that it corresponds to the distance between the first edge region 1100 and the second edge region 1200 of an LED module 110, 120, 130.

Figure 7:
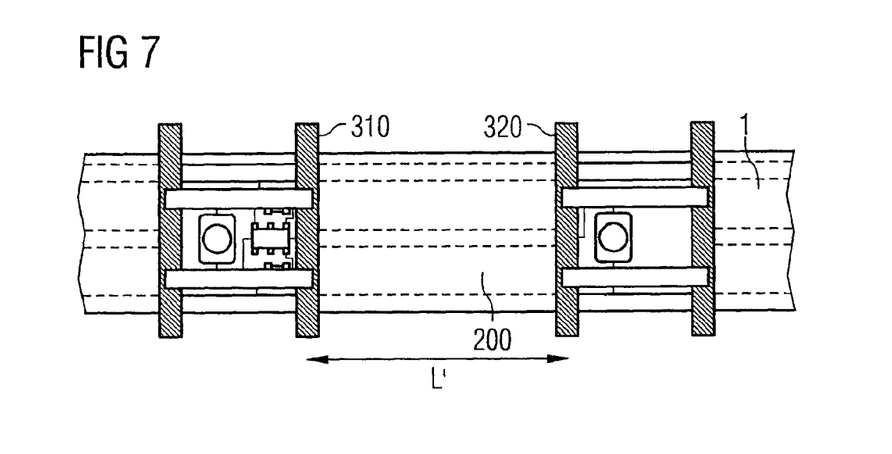
FIG. 7 shows a schematic plan view of a light emitting diode arrangement in one variant of the production method in accordance with the first exemplary embodiment in the stage of FIG. 5.

In the present case, the distance between the first stamp 310 and the second stamp 320 can be set for different lengths L, L' of the connection carrier 200 (cf. FIGS. 5 and 7). Thus, light emitting diode arrangements having different distances between the LED modules 110, 120, 130 can be produced by means of the same stamps 310, 320, that is to say for example in the same production installation, without complicated changes to the latter being required.

Figure 8:
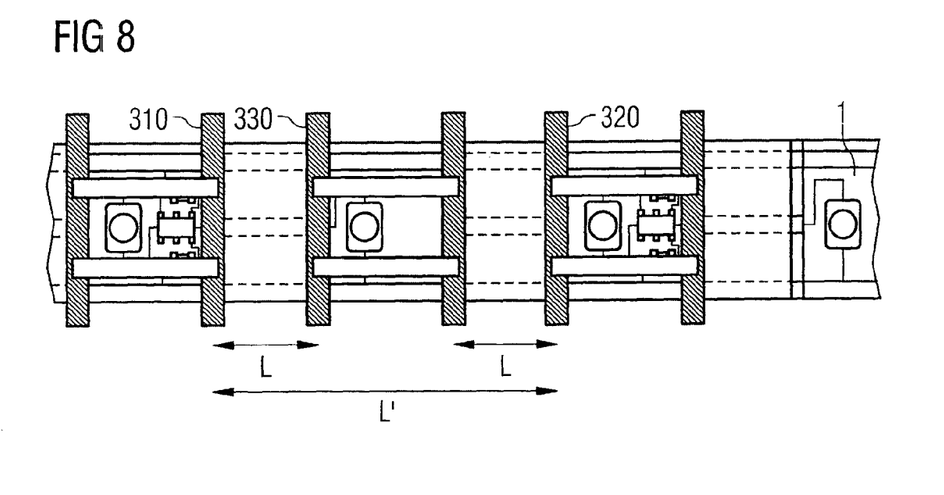
FIG. 8 shows a schematic plan view of a light emitting diode arrangement in a further variant of the production method in accordance with the first exemplary embodiment in the stage of FIG. 5.

The distance between the heated stamps 310, 320 can be set for example by shifting the stamps 310, 320 on a mount 300. As an alternative or in addition, the distance between two stamps can be set by using a variable number of stamps, for example a stamp being fixed or omitted at a predetermined position of the mount. By way of example, the first stamp 310 and the second stamp 320 have a distance which is suitable for producing a connection by means of a connection carrier 220 having a first length L', for example 50 mm. In order to produce a light emitting diode arrangement with connection carriers having a length L of 14 mm, for example, a third heated stamp 330 is arranged between the first stamp 310 and the second stamp 320 (see FIG. 8), such that the distance between the first stamp 310 and the third stamp 330 and the distance between the third stamp 330 and the second stamp 320 are suitable for use with connection carriers 200 having a length L of 14 mm, for example.

The production of the mechanically stable and electrically conductive connection is repeated with further LED modules 110, 120, 130 and further connection carriers 200 until the light emitting diode arrangement 1 has been completed with the desired number of LED modules 110, 120, 130.

Figure 6:
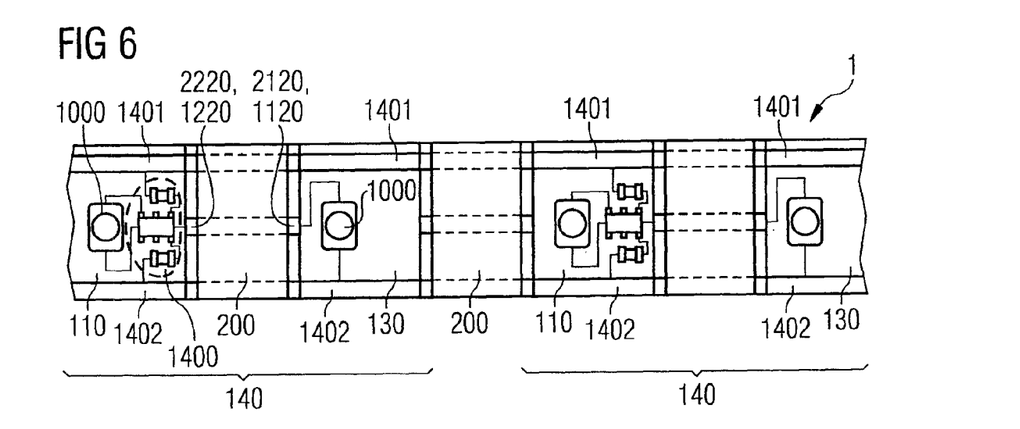

The light emitting diode arrangement 1 produced by the method in accordance with the first exemplary embodiment is shown in FIG. 6. It comprises groups 140 of LED modules 110 and 130. In the light emitting diode arrangement in accordance with the first exemplary embodiment, each group of LED modules comprises a start module 110, which in the present case comprises the control device 1400 alongside the radiation emitting semiconductor component 1000, and an end module 130, the radiation emitting semiconductor component 1000 of which is electrically conductively connected to the second contact strip 1402. The radiation emitting semiconductor component 1000 of the end module 130 is electrically conductively connected to the radiation emitting semiconductor component 1000 of the start module by means of the connection carrier 200 and by means of the central electrical terminals 1120, 2120, 2220 and 1220 and also by means of conductor tracks 1403. The two semiconductor components 1000 are therefore connected in series.

In addition, the first contact strips 1401 of the LED modules 110, 120, 130 are electrically conductively connected by means of the connection carriers 200. Likewise, the second electrical contact strips 1402 of the LED modules 110, 120, 130 are electrically conductively connected to one another. In this way, the individual groups 140 of LED modules 110, 120, 130 are connected in parallel.

Figure 9:
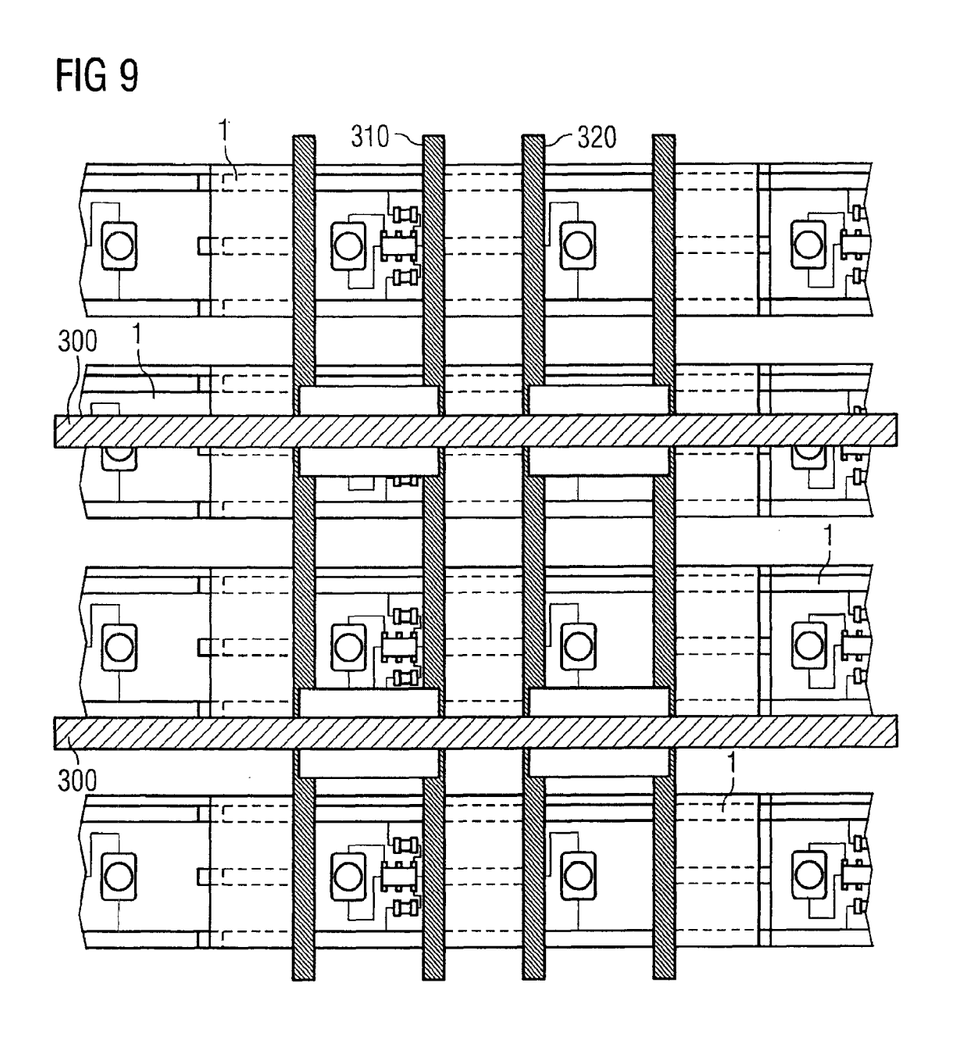
FIG. 9 shows a schematic plan view of a plurality of light emitting diode arrangements in a production method in accordance with a development of the first exemplary embodiment.

In a preferred development of the first exemplary embodiment of the method, a plurality of light emitting diode arrangements 1 are produced at identical times. This is done for example by arranging a plurality of light emitting diode arrangements 1 alongside one another, that is to say perpendicular to the direction of the chains of LED modules, during the production of the mechanically stable and electrically conductive connection (FIG. 9). By way of example, the first and the second heated stamp 310, 320 extend over a plurality of light emitting diode arrangements 1, such that when the stamps 310, 320 are pressed on by means of the mount 300, connection carriers of a plurality of light emitting diode arrangements are connected to the respectively adjacent LED modules.

Figure 10:
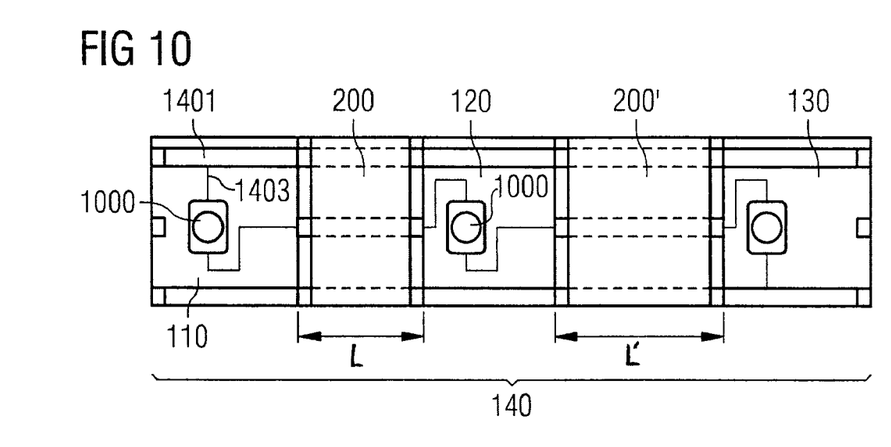
FIG. 10 shows a schematic plan view of a light emitting diode arrangement in accordance with a second exemplary embodiment.

Whereas in the light emitting diode arrangement in accordance with the first exemplary embodiment, each group 140 of LED modules 110, 120, 130 comprises only a start module 110 and an end module 130, a group 140 of LED modules 110, 120, 130 in the light emitting diode arrangement in accordance with the second exemplary embodiment, which is illustrated in FIG. 10, additionally comprises a central LED module 120. The radiation emitting semiconductor components 1000 of the start module 110, of the central module 120 and of the end module 130 are connected in series by means of the two connection carriers 200, 200'.

The control unit 1400 is dispensed with in the second exemplary embodiment. Instead, the radiation emitting semiconductor component 1000 of the start module 110 is electrically conductively connected directly to the first contact strip 1401 by means of a conductor track 1403.

The lengths L, L' of the connection carriers 200 and 200' are different in the present case. The radiation emitting semiconductor components 100 of adjacent LED modules 110, 120, 130, for example, therefore have different distances in the present light emitting diode arrangement 1.

Figure 11:
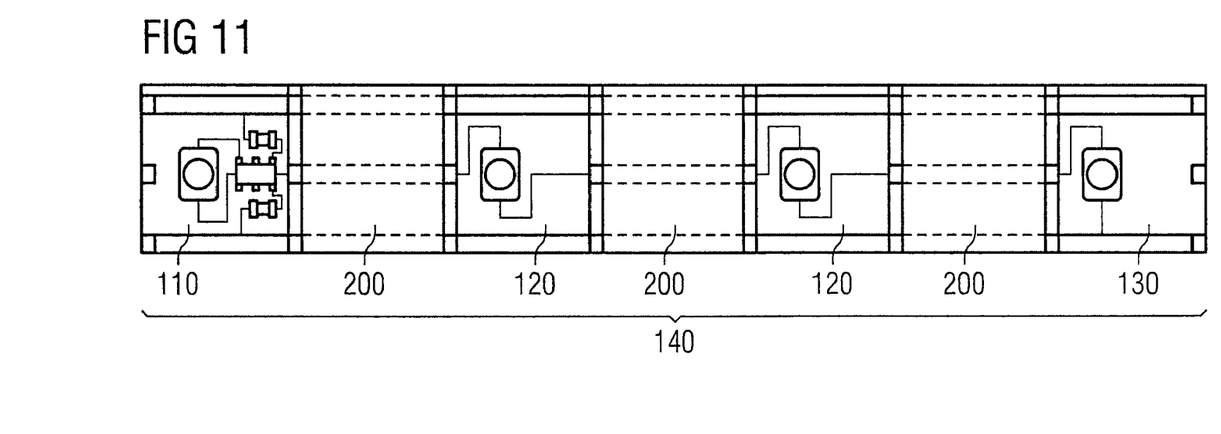
FIG. 11 shows a schematic plan view of a light emitting diode arrangement in accordance with a third exemplary embodiment.

In the light emitting diode arrangement 1 in accordance with the third exemplary embodiment illustrated in FIG. 11, each group 140 of LED modules comprises a plurality of central LED modules 120. In the present case, each group 140 of LED modules comprises two central LED modules 120. In this exemplary embodiment, too, the radiation emitting semiconductor components 1000 of a group 140 of LED modules 110, 120, 130 are connected in series.

Figure 12:
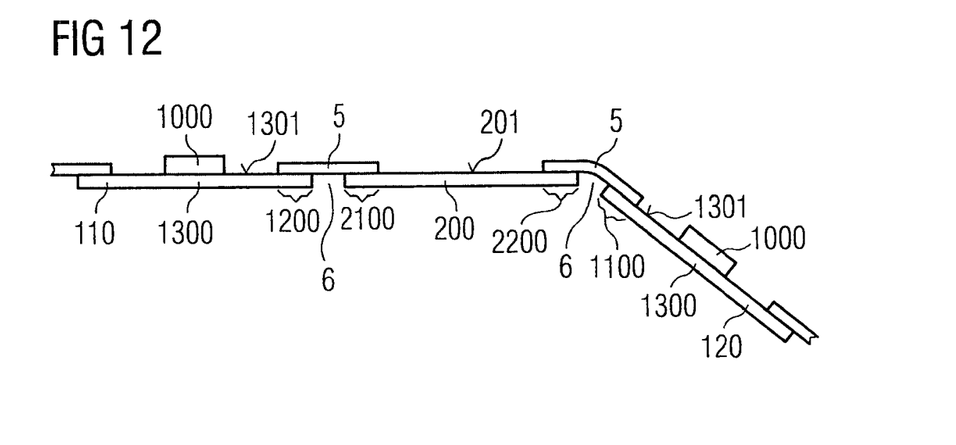
FIG. 12 shows a schematic cross section through an excerpt from a light emitting diode arrangement in accordance with a fourth exemplary embodiment.

In contrast to the light emitting diode arrangement 1 in accordance with the previous exemplary embodiments, the connection carriers 200 in the fourth exemplary embodiment do not overlap the LED modules 110, 120, 130 between which they are arranged (cf. FIG. 12). Rather, they are spaced apart from said modules, such that a gap 6 remains between a carrier body 1300 and an adjacent connection carrier 200. A connection element 5, a film hinge in the present case, is arranged in the first edge region 1100 of the carrier body 1300, the gap 6 and the second edge region 2200 of the connection carrier 200, and in the second edge region 1200 of the carrier body 1300, the gap 6 and the first edge region 2100 of the connection carrier 200. The first main face 1301 of the carrier body 1300 and the first main face 201 of the connection carrier 200 face the film hinge 5—and not one another—in this exemplary embodiment.

The film hinge 5 comprises a flexible circuit board, for example, which is printed with electrically conductive structures such as conductor tracks which electrically conductively connect in each case an electrical terminal 1110, 1120, 1130 of the first edge region 1100 of the carrier body 1300 to an electrical terminal 2210, 2220, 2230 of the second edge region 2200 of the connection carrier 200, and in each case an electrical terminal 1210, 1220, 1230 of the second edge region 1200 of the carrier body 1300 to an electrical terminal 2110, 2120, 2130 of the first edge region 2100 of the connection carrier 200.

The mechanically stable and electrically conductive connection is produced for example—as in the previous exemplary embodiments—in the edge regions 1100, 1200, 2100, 2200 by means of one or a plurality of heated stamps 310, 320, 330.

Figure 13:
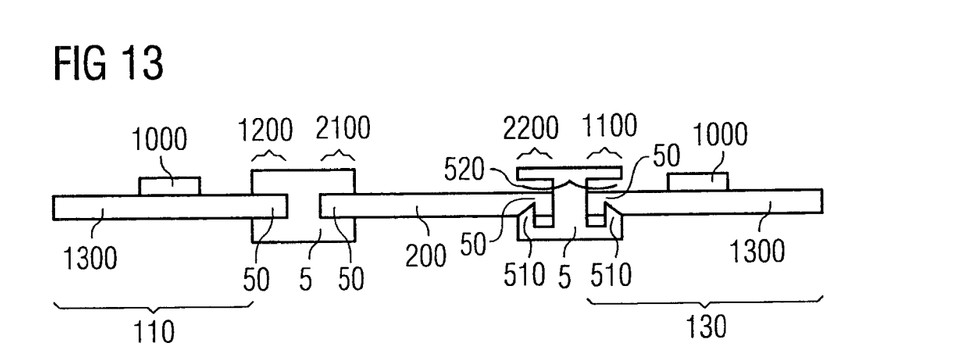
FIG. 13 shows a schematic cross section through a part of a light emitting diode arrangement in accordance with a fifth exemplary embodiment.

The LED modules 110, 120, 130 of the light emitting diode arrangement 1 in accordance with the fifth exemplary embodiment are not connected by means of a process comprising the melting of a connection layer. Instead, as illustrated schematically in FIG. 13, a plug connection 5 is formed between mutually adjacent edge regions 1200, 2200 and respectively 1100, 2100 of the LED module 110, 120, 130 and of the connection carrier 200 (cf. FIG. 13). The edge regions 1200, 2100 and respectively 1100, 2200 engage in depressions 50 of the plug connector 5. By way of example, mechanical fixing elements 510, for instance catches, are provided in the depressions 50 and engage in depressions in the carrier body 1300 and in the connection carrier 200, as illustrated by way of example in the right-hand region of FIG. 13. The electrically conductive connection is produced in the present case by means of metallic springs 520 which electrically conductively connect electrical terminal regions 2210, 2220, 2230 and respectively 2110, 2120, 2130 of the connection carrier 200 (see FIG. 2A) and electrical terminal regions 1110, 1120, 1130 and respectively 1210, 1220, 1230 of the carrier body 1300 (see FIGS. 1A and 1C) to one another.

Figure 14A:
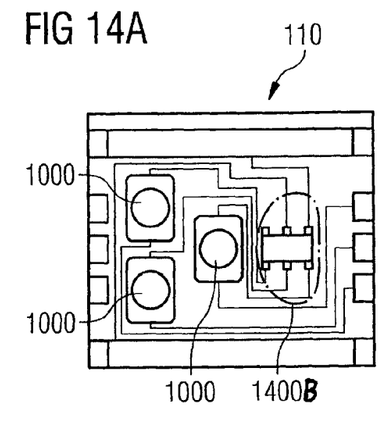
FIGS. 14A to 14C show LED modules for a light emitting diode arrangement in accordance with a sixth exemplary embodiment.
Figure 14B:
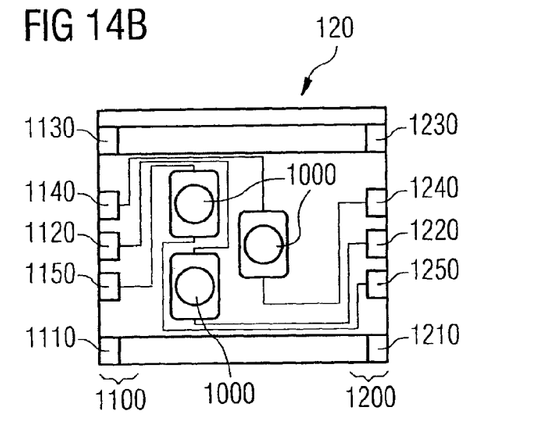
Figure 14C:
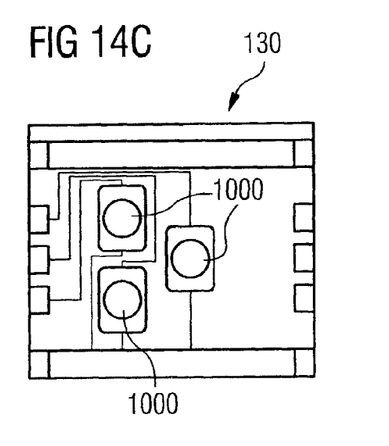

LED modules 110, 120, 130 for a light emitting diode arrangement 1 in accordance with a sixth exemplary embodiment are shown in FIGS. 14A, 14B and 14C. In contrast to the previous exemplary embodiment, each LED module 110, 120, 130 in accordance with the sixth exemplary embodiment contains a plurality, three for example, of radiation emitting semiconductor components 1000.

The LED module 110 shown in FIG. 14A is a start module and has a control device 1400B provided for example for driving the three radiation emitting semiconductor components 1000 arranged on the LED module.

The edge regions 1100, 1200 of the LED modules 110, 120, 130 have additional electrical terminals 1140, 1150, 1240, 1250, such that each of the radiation emitting semiconductor components 1000 can be individually electrically contact-connected.

Figure 14D:
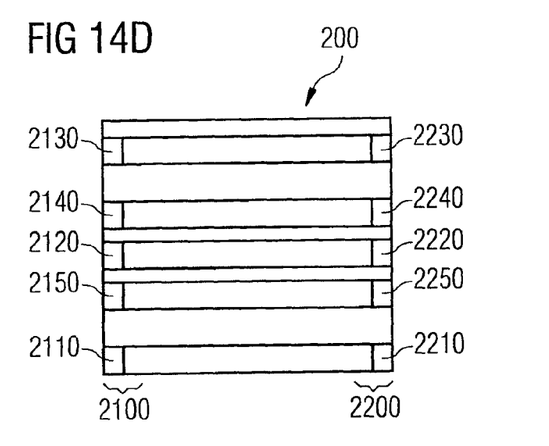
FIG. 14D shows a connection carrier for a light emitting diode arrangement in accordance with the sixth exemplary embodiment.

The connection carrier 200 (cf. FIG. 14D) likewise has additional electrical terminals 2140, 2150, 2240 and 2250, such that an electrically conductive connection is produced from each of the electrical terminals 1110, 1120, 1130, 1140, 1150 of the first edge region 1100 of an LED module 110, 120, 130 to one of the electrical terminals 1210, 1220, 1230, 1240, 1250 of the second edge region 1200 of an adjacent LED module 110, 120, 130.

The invention is not restricted to the exemplary embodiments by the description on the basis of said exemplary embodiments. Rather, the invention encompasses any new feature and also any combination of features, which in particular comprises any combination of features in the patent claims, even if this feature or this combination itself is not explicitly specified in the patent claims or exemplary embodiments.

I claim:

1. A method for producing a light emitting diode arrangement comprising the steps of:
   providing a plurality of LED modules, which in each case comprise at least one radiation emitting semiconductor component on a carrier body;
   providing at least one separately fabricated connection carrier;
   arranging the LED modules such that they are adjacent to one another in pairs; and
   producing a mechanically stable and electrically conductive connection between the carrier bodies of two LED modules by means of the connection carrier,
   wherein at least one element of the group consisting of the connection carrier, the carrier body of the first LED module, and the carrier body of the second LED module has in at least one region of the group consisting of its first edge region and its second edge region a connection layer provided for imparting an adhesion between the connection carrier and the carrier body,
   wherein producing the connection comprises heating and/or melting the connection layer, and
   wherein the connection layer is heated and/or melted in the first edge region by means of a first heated stamp and the connection layer is heated in the second edge region by means of a second heated stamp.

2. The method according to claim 1, in which the connection carrier is provided with a predetermined length.

3. The method according to claim 2, in which the distance between two adjacent LED modules after producing the connection is determined by the length of the connection carrier.

4. The method according to claim 1, in which providing the connection carrier comprises separating a segment having a predetermined length from a carrier tape or a carrier plate.

5. The method according to claim 1, in which the electrically conductive connection is produced in such a way that a plurality of radiation emitting semiconductor components are connected in series.

6. The method according to claim 1, in which the electrically conductive connection is produced in such a way that a plurality of LED modules are connected in parallel.

7. The method according to claim 1, in which a first and a second LED module are arranged at a predetermined distance and the connection carrier is arranged between the two LED modules in such a way that, after arranging the LED modules and the connection carrier, a first edge region of the second LED module and of the connection carrier are adjacent to or overlap one another, and in such a way that a second edge region of the first LED module and of the connection carrier are adjacent to or overlap one another.

8. The method according to claim 7, in which the mechanically stable and electrically conductive connection is produced by means of a film hinge.

9. The method according to claim 8, in which the film hinge comprises a flexible circuit board.

10. The method according to claim 1, in which producing the connection comprises producing a plug connection.

11. The method according to claim 1, in which producing the connection comprises an adhesive bonding process.

12. The method according to claim 11, in which the connection layer contains an electrically conductive adhesive.

13. The method according to claim 1, in which producing the connection comprises a soldering process.

14. The method according to claim 1, in which the distance between the two stamps is adapted to the length of the connection carrier.

15. The method according to claim 14, in which the distance between the two stamps can be set for different lengths.

16. The method according to claim 1, in which the two stamps are arranged on a common mount.

17. The method according to claim 1, in which a plurality of pairs of LED modules are connected at the same time.

18. The method according to claim 1, in which a plurality of light emitting diode arrangements are produced at the same time.

19. A method for producing a light emitting diode arrangement comprising the steps of:
   providing a plurality of LED modules, which in each case comprise at least one radiation emitting semiconductor component on a carrier body;
   providing at least one separately fabricated connection carrier;
   arranging the LED modules such that they are adjacent to one another in pairs; and
   producing a mechanically stable and electrically conductive connection between the carrier bodies of two LED modules by means of the connection carrier,
   wherein the connection carrier, one first LED module and one second LED module are arranged in such a way that a first edge region of the connection carrier overlaps one edge region of the carrier body of the first LED module and a second edge region of the connection carrier overlaps one edge region of the carrier body of the second LED module being adjacent to the first LED module, so that a distance between the first LED module and second LED module is chosen essentially freely and is determined by a freely chosen length of the connection carrier, and
   wherein the method provides a plurality of separately fabricated connection carriers having different lengths so that the light emitting diode arrangement has different distances between the LED modules.

* * * * *